United States Patent
Zhang et al.

(10) Patent No.: US 12,082,436 B2
(45) Date of Patent: Sep. 3, 2024

(54) DISPLAY SUBSTRATE HAVING AUXILIARY ELECTRODES, DISPLAY PANEL HAVING AUXILIARY ELECTRODES, AND MANUFACTURING METHOD OF SAID DISPLAY PANEL AND DISPLAY DEVICE HAVING AUXILIARY ELECTRODES

(71) Applicant: BOE Technology Group Co., Ltd., Beijing (CN)

(72) Inventors: Xing Zhang, Beijing (CN); Wei Quan, Beijing (CN); Yicheng Lin, Beijing (CN); Pan Xu, Beijing (CN); Ling Wang, Beijing (CN); Guoying Wang, Beijing (CN); Ying Han, Beijing (CN); Zhan Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 575 days.

(21) Appl. No.: 17/279,771

(22) PCT Filed: Jun. 2, 2020

(86) PCT No.: PCT/CN2020/093832
§ 371 (c)(1),
(2) Date: Mar. 25, 2021

(87) PCT Pub. No.: WO2020/244488
PCT Pub. Date: Dec. 10, 2020

(65) Prior Publication Data
US 2021/0343973 A1 Nov. 4, 2021

(30) Foreign Application Priority Data
Jun. 3, 2019 (CN) .......................... 201910477115.2

(51) Int. Cl.
*H10K 50/824* (2023.01)
*H10K 50/828* (2023.01)
(Continued)

(52) U.S. Cl.
CPC ......... *H10K 50/824* (2023.02); *H10K 50/828* (2023.02); *H10K 59/122* (2023.02); *H10K 71/00* (2023.02); *H10K 59/1201* (2023.02)

(58) Field of Classification Search
CPC .. H10K 50/824; H10K 50/828; H10K 59/122; H10K 71/00; H10K 59/1201
(Continued)

(56) References Cited

U.S. PATENT DOCUMENTS

2008/0290787 A1* 11/2008 Cok .................. H10K 50/805
                                                                313/503
2009/0146557 A1* 6/2009 Shinto ................. H10K 50/82
                                                                313/504
(Continued)

FOREIGN PATENT DOCUMENTS

CN          101452947 A       6/2009
CN          103380660 A      10/2013
(Continued)

OTHER PUBLICATIONS

The First Office Action with Search Report dated 2020-09-01 corresponding to Chinese application No. 201910477115.2.

*Primary Examiner* — Nduka E Ojeh
*Assistant Examiner* — Eric W Jones
(74) *Attorney, Agent, or Firm* — Nath, Goldberg & Meyer; Joshua B. Goldberg

(57) ABSTRACT

The present disclosure provides a display substrate, including: a base substrate, which includes a display region and a driving region arranged on at least one side of the display region; a first electrode layer disposed in the display region;
(Continued)

a signal output part disposed in the driving region, the first electrode layer is electrically coupled to the signal output part, the first electrode layer comprises a plurality of electrode regions each having a same area; and a plurality of auxiliary electrodes, which are in one-to-one correspondence with the plurality of electrode regions and configured to be coupled in parallel with the first electrode layer, a resistance of each auxiliary electrode is inversely correlated with a minimum distance from the electrode region corresponding to said each auxiliary electrode to the signal output part. The present disclosure further provides a display panel and a manufacturing method thereof and a display device.

15 Claims, 4 Drawing Sheets

(51) Int. Cl.
*H10K 59/12* (2023.01)
*H10K 59/122* (2023.01)
*H10K 71/00* (2023.01)

(58) Field of Classification Search
USPC .................................................... 257/40, 59
See application file for complete search history.

(56) References Cited

U.S. PATENT DOCUMENTS

| 2014/0203260 | A1* | 7/2014 | Ookawara | ............. | H10K 50/84 |
| | | | | | 257/40 |
| 2019/0165068 | A1* | 5/2019 | Park | ...................... | H10K 59/126 |
| 2020/0343315 | A1* | 10/2020 | Lin | ...................... | H10K 59/126 |

FOREIGN PATENT DOCUMENTS

| CN | 104091818 A | 10/2014 |
| CN | 106328676 A | 1/2017 |
| CN | 107004695 A | 8/2017 |
| CN | 107331690 A | 11/2017 |
| CN | 108933154 A | 12/2018 |
| CN | 109817671 A | 5/2019 |
| CN | 110212114 A | 9/2019 |
| KR | 20160027538 A | 3/2016 |

* cited by examiner

DISPLAY SUBSTRATE HAVING AUXILIARY ELECTRODES, DISPLAY PANEL HAVING AUXILIARY ELECTRODES, AND MANUFACTURING METHOD OF SAID DISPLAY PANEL AND DISPLAY DEVICE HAVING AUXILIARY ELECTRODES

CROSS REFERENCE TO RELATED APPLICATIONS

This is a National Phase Application filed under 35 U.S.C. 371 as a national stage of PCT/CN2020/093832, filed Jun. 2, 2020, an application claiming the benefit of Chinese patent application No. 201910477115.2 filed at the Chinese Intellectual Property Office on Jun. 3, 2019, the entire contents of each of which are incorporated herein by reference.

TECHNICAL FIELD

The present disclosure relates to the field of display technology, in particular to a display substrate, a display panel, a manufacturing method of the display panel and a display device.

BACKGROUND

A top-emission type organic light-emitting diode (OLED) includes a cathode and an anode, and an organic functional layer between the cathode and the anode.

The anode of the OLED device is generally manufactured by using a metal having a low work function, such as aluminum, magnesium and silver, through an evaporation or sputtering process. The cathode of the OLED device is generally manufactured by using a conductive material having high light transmittance, such as indium zinc oxide (IZO).

SUMMARY

An embodiment of the present disclosure provides a display substrate, including: a base substrate, which includes a display region and a driving region arranged on at least one side of the display region; a first electrode layer disposed in the display region; a signal output part disposed in the driving region, the first electrode layer is electrically coupled to the signal output part, and the first electrode layer includes a plurality of electrode regions each having a same area; and a plurality of auxiliary electrodes, which are in one-to-one correspondence with the plurality of electrode regions and configured to be coupled in parallel with the first electrode layer, where a resistance of each auxiliary electrode is inversely correlated with a minimum distance from the electrode region corresponding to said each auxiliary electrode to the signal output part.

In some implementations, the auxiliary electrode includes at least one conductive part having a resistance inversely correlated with a minimum distance from the electrode region corresponding to the conductive part to the signal output part, and conductive parts coupled in parallel to the first electrode layer are uniformly distributed.

In some implementations, a pixel defining layer is further disposed in the display region, and the pixel defining layer is located between the base substrate and the first electrode layer;

a first groove is provided on a side of the pixel defining layer away from the base substrate;

the conductive part is located in the first groove and on a side of the first electrode layer away from the base substrate.

In some implementations, the conductive part includes a plurality of nano metal particles disposed in the first groove.

In some implementations, the number of the nano metal particles of the conductive part is positively correlated with a minimum distance from the conductive part to the signal output part.

An embodiment of the present disclosure further provides a display panel, including the display substrate described above.

In some implementations, the display panel further includes an opposite substrate which is arranged opposite to the display substrate; where
a spacer is provided at a position corresponding to the first groove on a side of the opposite substrate facing the base substrate; and
a second groove is provided on a side of the spacer facing the base substrate.

In some implementations, an orthographic projection of the second groove on the base substrate is within an orthographic projection of the first groove corresponding thereto on the base substrate.

In some implementations, a volume of the second groove is positively correlated with the number of the nano metal particles of the conductive part corresponding thereto.

An embodiment of the present disclosure further provides a display device, including the display panel described above.

An embodiment of the present disclosure further provides a manufacturing method of a display panel, including:
providing a base substrate, where the base substrate includes a display region and a driving region arranged on at least one side of the display region;
forming a signal output part in the driving region;
forming a first electrode layer in the display region, the first electrode layer being electrically coupled to the signal output part; a region where the first electrode layer is located is divided into a plurality of electrode regions each having a same area;
forming a plurality of auxiliary electrodes in one-to-one correspondence with the electrode regions; the auxiliary electrodes are coupled in parallel with the first electrode layer, and a resistance of each auxiliary electrode is inversely correlated with a minimum distance from the electrode region corresponding to said each auxiliary electrode to the signal output part.

In some implementations, the manufacturing method further includes:
before forming the first electrode layer in the display region, forming a pixel defining layer in the display region, the pixel defining layer being located between the base substrate and the first electrode layer; and a first groove is formed on a side of the pixel defining layer away from the base substrate;
the manufacturing method further includes the following steps:
providing an opposite substrate to be arranged opposite to the base substrate;
forming a spacer at a position corresponding to the first groove on a side of the opposite substrate facing the base substrate, where a second groove is formed on a side of the spacer facing the base substrate;
the forming the plurality of auxiliary electrodes in one-to-one correspondence with the electrode regions further includes:

forming an intermediate conductive part in each second groove;

aligning and assembling the base substrate and the opposite substrate to enable the intermediate conductive part in the second groove to fall into the first groove to form a conductive part;

where the auxiliary electrode includes at least one conductive part in the first groove.

In some implementations, a volume of the second groove is inversely correlated with a resistance of the conductive part corresponding thereto, and conductive parts coupled in parallel to the first electrode layer are uniformly distributed;

the forming the intermediate conductive part in each second groove includes:

injecting ink into the second groove, where the ink includes nano metal particles, and the number of the nano metal particles in the second groove is positively correlated with the volume of the second groove;

drying the ink to form the intermediate conductive part in the second groove.

DESCRIPTION OF DRAWINGS

The drawings are used to provide a further understanding of the present disclosure, constitute a part of the present description, and are used to explain the present disclosure together with the following specific embodiments, but do not constitute a limitation on the present disclosure. In the drawings.

DESCRIPTION OF EMBODIMENTS

Specific embodiments of the present disclosure are described in detail below in combination with the accompanying drawings. It should be understood that the specific embodiments described herein are only used to illustrate and explain the present disclosure and are not used to limit the present disclosure.

In the related art, a cathode of an OLED device is manufactured by using a material having high-transmittance, such as indium zinc oxide (IZO), since the manufactured cathode has a relatively high impedance, a voltage attenuation occurs on the cathode, which seriously affects the uniformity of display brightness of a screen.

Figure 1:
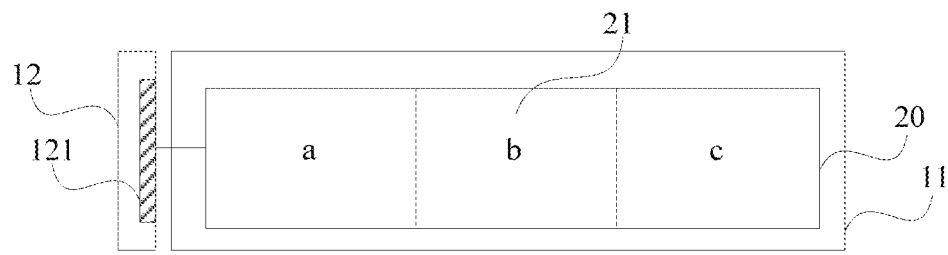
FIG. 1 is a schematic diagram of a display substrate according to an embodiment of the present disclosure.
Figure 2:
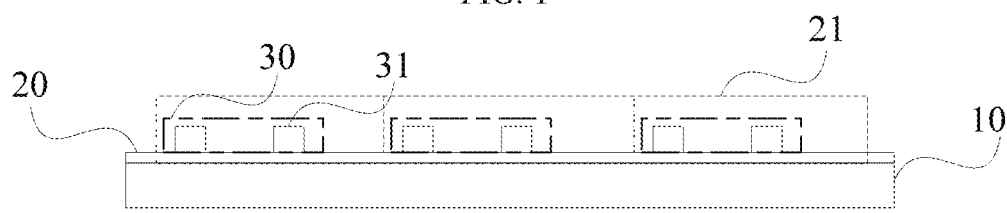
FIG. 2 is a longitudinal section diagram of a display substrate according to an embodiment of the present disclosure.

An embodiment of the present disclosure provides a display substrate, FIG. 1 is a schematic diagram of the display substrate provided in the present embodiment, FIG. 2 is a longitudinal section diagram of the display substrate provided in the present embodiment, and as shown in FIG. 1 and FIG. 2, the display substrate includes: a base substrate 10. The base substrate 10 includes a display region 11 and a driving region 12 disposed on at least one side of the display region 11. The display region 11 is provided with a first electrode layer 20 therein, the driving region 12 is provided with a signal output part 121, and the first electrode layer 20 is electrically coupled to the signal output part 121. The driving region 12 may also be provided with a driving circuit, such as a GOA circuit.

The display substrate may be a single-end driven display substrate or a double-end driven display substrate, the single-end driven display substrate refers to one in which only one side of the display region 11 is provided with the driving region 12, and the first electrode layer 20 is electrically coupled to the signal output part 121 of the driving region 12 at one side of the first electrode layer 20; the double-end driven display substrate refers to one in which opposite sides of the display region 11 are provided with driving regions 12, and the first electrode layer 20 is electrically coupled to the two driving regions 12, respectively, at two opposite sides of the first electrode layer 20.

The first electrode layer 20 may be a continuous entire film layer disposed in the display region, and a region where the first electrode layer is disposed is divided into a plurality of electrode regions 21 each having a same area, and the plurality of electrode regions 21 may be sequentially arranged along a left-right direction in FIG. 1, or may be distributed in an array. The display substrate further includes auxiliary electrodes 30 corresponding to the respective electrode regions 21 one by one, and a resistance of the auxiliary electrode 30 is inversely correlated with a minimum distance from the electrode region 21 corresponding to the auxiliary electrode 30 to the signal output part 121.

When there is only one driving region 12, the minimum distance from the electrode region 21 to the signal output part 121 is the distance from the electrode region 21 to the signal output part 121 in the driving region 12; when there are two driving regions 12, the minimum distance from the electrode region 21 to the signal output part 121 is the distance from the electrode region 21 to the signal output part 121 in one of the drive regions 12 closer to said electrode region 21.

Note that, in the embodiment of the present disclosure, the first electrode layer 20 may be a cathode layer; in addition, the display substrate of the present disclosure is particularly suitable for a top emission structure, and in this case, the first electrode layer 20 is formed by using a transparent conductive material such as indium zinc oxide (IZO) or indium tin oxide (ITO).

As the distance from the electrode region 21 to the driving region 12 increases, the voltage attenuation on the first electrode layer 20 also increases, which seriously affects the uniformity of the display brightness of the screen. When the first electrode layer 20 is made of transparent conductive material, the problem of non-uniformity of the display brightness is more serious. By adopting the display substrate of the present embodiment, the auxiliary electrodes 30 are electrically coupled in parallel to the first electrode layer 20, the farther the auxiliary electrode 30 is from the driving region 12, the smaller the resistance of the auxiliary electrode is, and the larger the correction degree of the auxiliary electrode 30 on the voltage attenuation is, so that voltages at positions of the first electrode layer 20 are kept consistent, and the uniformity of the display brightness in the display region 11 is improved.

For example, as shown in FIG. 1, the region where the first electrode layer 20 is located is divided into three electrode regions, which are an electrode region 21 at a position a, an electrode region 21 at a position b, and an electrode region 21 at a position c, and the three electrode regions 21 each have a same area, and the minimum distances from the electrode regions 21 to the signal output part 31 increase one by one from left to right. As the distance from the electrode region 21 to the driving region 12 increases, the voltage attenuation also increases gradually, and in order to ensure the display effect of the display region, a specific correction needs to be performed according to the degree of the voltage attenuation, therefore, as shown in FIG. 2, the auxiliary electrodes 30 coupled in parallel with the first electrode layer 20 are provided in the electrode regions 21 at the positions a, b and c, respectively, and the resistance of the auxiliary electrode coupled in parallel to the electrode region at the position b is smaller than that of the auxiliary electrode coupled in parallel to the electrode region at the position a, and is greater than that of the auxiliary electrode coupled in parallel to the electrode region at the position c.

Figure 3:
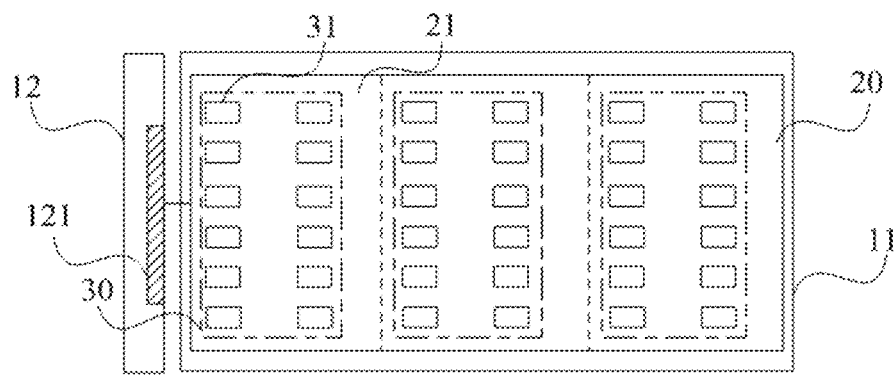
FIG. 3 is a schematic diagram of a distribution of conductive parts according to an embodiment of the present disclosure.

FIG. 3 is a schematic diagram of a distribution of conductive parts provided in the present embodiment, and as shown in FIG. 3, the auxiliary electrode 30 includes at least one conductive part 31, a resistance of the conductive part 31 is inversely correlated with a minimum distance from the electrode region 21 corresponding thereto to the signal output part 121, and conductive parts 31 electrically coupled in parallel to the first electrode layer 20 are uniformly distributed.

It should be noted that, in a case where the auxiliary electrode 30 includes the plurality of conductive parts 31, the resistance of the auxiliary electrode 30 corresponds to a resistance of the plurality of conductive parts 31 coupled in parallel.

Specifically, the conductive part 31 is made of a conductive metal material, such as magnesium (Mg), gold (Au), aluminum (Al), silver (Ag), or an alloy composed of at least two of magnesium, gold, aluminum, and silver, or nano metal particles including one or more of magnesium, gold, aluminum, and silver, and the like, and is not limited herein. The conductive part 31 may be arranged on a side of the first electrode layer away from the base substrate, or may be arranged between the electrode layer and the base substrate.

Figure 4:
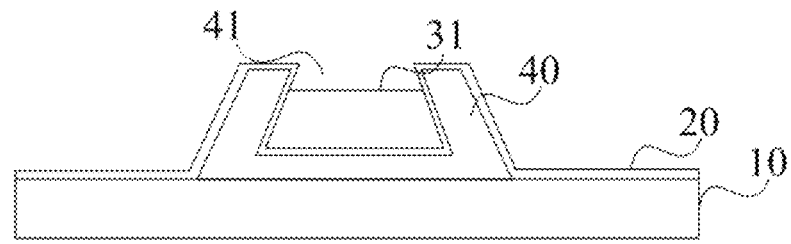
FIG. 4 is a schematic diagram of a display substrate including a first groove according to an embodiment of the present disclosure.

FIG. 4 is a schematic diagram of a display substrate including a first groove according to an embodiment of the present disclosure, as shown in FIG. 4, in an embodiment of the present disclosure, a pixel defining layer 40 is further disposed in the display region 11, and the pixel defining layer 40 is located between the base substrate 40 and the first electrode layer 20.

A first groove 41 is provided on a side of the pixel defining layer 40 away from the base substrate 10.

The conductive part 31 is located in the first groove 41 and on a side of the first electrode layer 20 away from the base substrate 10.

Specifically, since the pixel defining layer 40 is located on the side of the first electrode layer 20 proximal to the base substrate 10, the first electrode layer 20 can cover sidewalls and a bottom surface of the first groove 41, so that the conductive part 31 disposed in the first groove 41 is in contact with the first electrode layer 20 and coupled in parallel to the first electrode layer 20. Moreover, since the conductive part 31 is provided in the first groove 41, the conductive part 31 in the embodiment of the present disclosure is the conductive part 31 in a fixed form or the conductive parts 31 in a non-fixed form.

It should be noted that, in the embodiment of the present disclosure, the first groove 41 is disposed in the pixel defining layer 40, but besides the first groove 41 disposed in the pixel defining layer 40, the first groove 41 may also be disposed in another layer structure located between the first electrode layer 20 and the base substrate 10.

When the conductive part 31 is in the fixed form, the resistivity, size or cross-sectional size of the conductive part 31 may be adjusted to decrease the resistance of the conductive part 31 with the increase of the minimum distance from the electrode region 21 where the conductive part 31 is located to the signal output part 121.

In some implementations, the conductive part 31 includes a plurality of nano metal particles, and the nano metal particles may be nano gold particles or nano silver particles, and certainly, the material of the nano metal particles may also include one or more of magnesium, aluminum, and silver.

In some implementations, the number of the nano metal particles of the conductive part 31 is positively correlated with the minimum distance from the conductive part 31 to the signal output part 31. The larger the number of nano metal particles is, the smaller the resistance of the conductive part 31 is. The embodiment of the present disclosure further provides a display panel, which includes the display substrate described above.

As mentioned above, in some implementations, the auxiliary electrode 30 of the display substrate includes at least one conductive part 31, the resistance of the conductive part 31 is inversely correlated with the minimum distance from the electrode region 21 corresponding to the conductive part 31 to the signal output part 121, and the conductive parts 31 coupled in parallel with the first electrode layer 20 are uniformly distributed.

Figure 5:
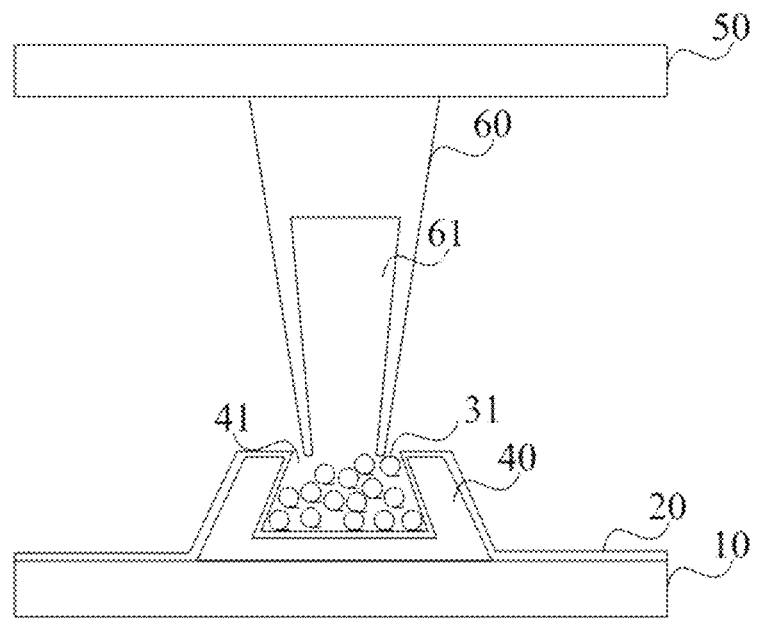
FIG. 5 is a schematic diagram of a display panel according to an embodiment of the present disclosure.

FIG. 5 is a schematic diagram of a display panel according to an embodiment of the present disclosure, and as shown in FIG. 5, the display panel further includes an opposite substrate 50 disposed opposite to the display substrate.

A spacer 60 is provided at a position corresponding to the first groove 41 on a side of the opposite substrate 50 facing the base substrate 10.

A second groove 61 is provided on a side of the spacer 60 facing the base substrate 10.

Specifically, an orthographic projection of the second groove 61 on the base substrate 10 is located within an orthographic projection of the first groove 41 on the base substrate 10, therefore, after the base substrate 10 and the opposite substrate 50 are aligned and assembled, the spacer 60 can be in contact with the first electrode layer 20, and the second groove 61 is correspondingly communicated with the first groove 41. It should be noted that when the conductive part 31 is disposed, an intermediate conductive part may be first manufactured in the second groove 61, and after the base substrate 10 and the opposite substrate 50 are aligned and assembled, the intermediate conductive part is located in a space formed by the second groove 61 and the first groove 41 for accommodating the conductive part, so as to form the conductive part 31, and the conductive part 31 contacts the first electrode layer 20 and is coupled in parallel with the first electrode layer 20.

In summary, when the conductive part 31 is made of the nano metal particles, since the first groove 41 and the second groove 61 form the space for accommodating the conductive part, the nano metal particles can be prevented from leaking out and forming a defect of dark spot.

As described above, in an implementation, the number of the nano metal particles of the conductive part 31 is positively correlated to the minimum distance from the conductive part 31 to the signal output part 121.

Specifically, a volume of the second groove 61 increases as the number of the nano metal particles of the conductive part 31 corresponding to the second groove increases.

It should be noted that, when the conductive part 31 is disposed, an intermediate conductive part is first manufactured in the second groove 61, and then in the aligning and assembling process, the intermediate conductive part falls into the first groove 41 and contacts the first electrode layer 20 to form the conductive part 31, so that the volume of the second groove 61 determines the number of the nano metal particles of the intermediate conductive part, that is, the number of the nano metal particles of the conductive part 31 to be formed subsequently, and therefore, the larger the volume of the second groove 41 is, the larger the number of the nano metal particles of the conductive part 31 to be formed is. The volume of the second groove 61 can be controlled by adjusting a depth of the second groove 61.

Figure 6:
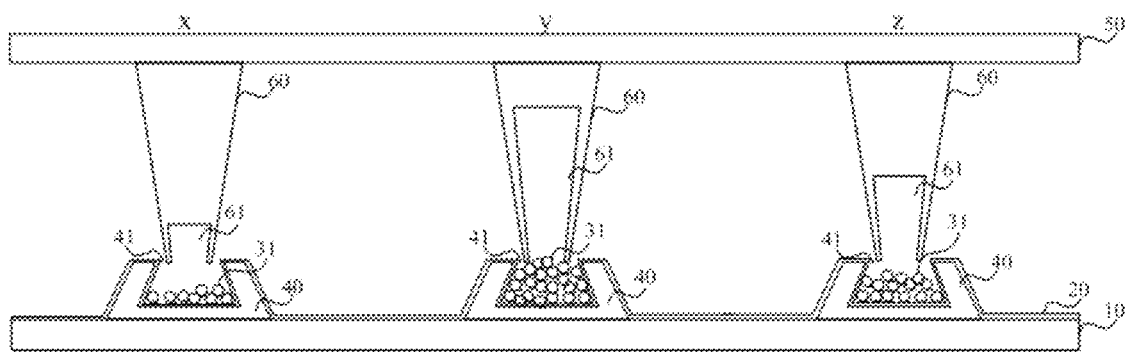
FIG. 6 is another schematic diagram of a display panel according to an embodiment of the present disclosure.

For example, FIG. 6 is a schematic diagram of a display panel according to an embodiment of the present disclosure, and as shown in FIG. 6, conductive parts 31 are disposed in all spaces formed by the first grooves 41 and the second grooves 61 at positions x, y and z, and the conductive parts 31 are nano metal particles; since the minimum distance from the position x to the signal output part 121 is smaller than the minimum distance from the position y to the signal output part 121, and the minimum distance from the position z to the signal output part 121 is smaller than the minimum distance from the position y to the signal output part 121 and larger than the minimum distance from the position x to the signal output part 121, the voltage attenuation degree at the position x is smaller than the voltage attenuation degree at the position z, the voltage attenuation degree at the position z is smaller than the voltage attenuation degree at the position y, and therefore, the depth of the second groove 61 at the position x is set to be smaller than the depth of the second groove 61 at the position y, and the depth of the second groove 61 at the position z is smaller than the depth of the second groove 61 at the position y and larger than the depth of the second groove 61 at the position x. With the depth of the second groove 61 is gradually increased, the volume of the second groove 61 is gradually increased, and the number of the nano metal particles of the formed conductive part 31 is gradually increased, so that the resistance of the conductive part 31 is gradually reduced.

The opposite substrate may be a color filter substrate, and specifically include a base substrate, a color filter layer and a black matrix located on the base substrate, and spacers are arranged at positions corresponding to the black matrix.

An embodiment of the present disclosure further provides a display device, which includes the display panel described above.

The display device may be any product or component with a display function, such as electronic paper, a mobile phone, a tablet personal computer, a television, a display, a notebook computer, a digital photo frame, a navigator and the like. Illustratively, the display device may be an OLED display panel.

Figure 7:
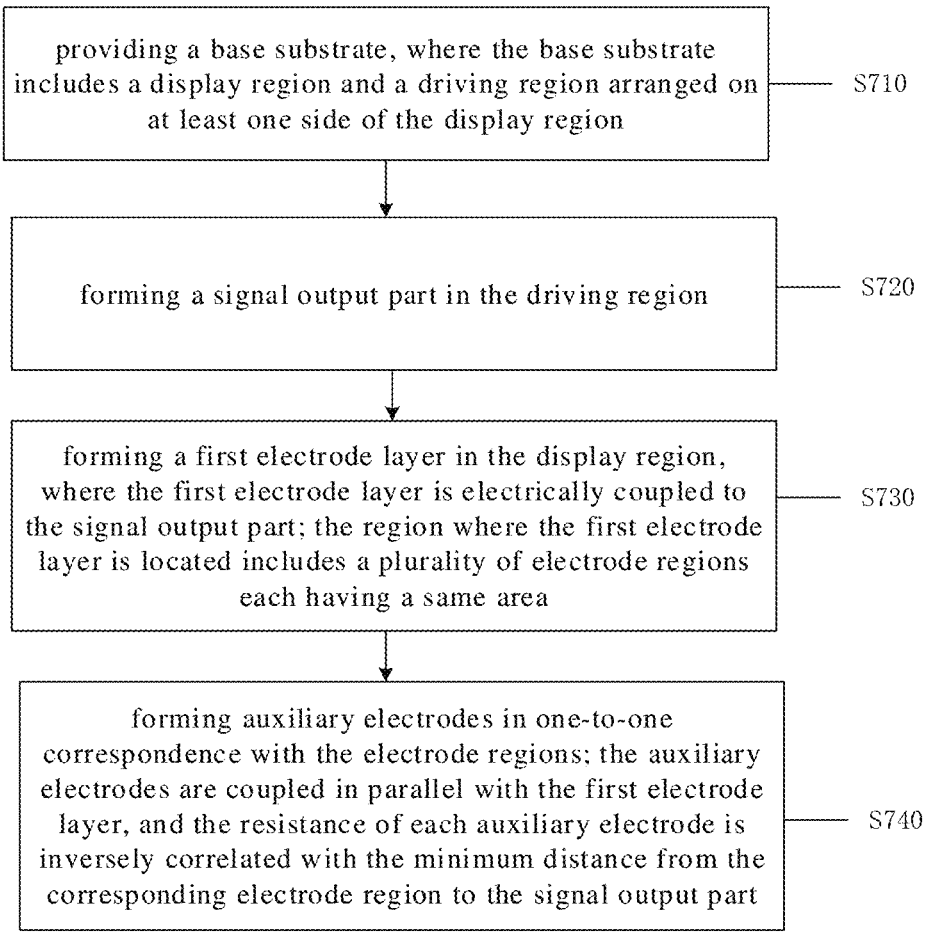
FIG. 7 is a flowchart of a manufacturing method of a display panel according to an embodiment of the present disclosure.

An embodiment of the present disclosure further provides a manufacturing method of a display panel, and FIG. 7 is a flowchart of the manufacturing method of the display panel according to an embodiment of the present disclosure, and as shown in FIG. 7, the manufacturing method includes the following steps S710 to S740.

At S710, providing a base substrate, where the base substrate includes a display region and a driving region arranged on at least one side of the display region.

Specifically, the base substrate may be a transparent substrate, which may be made of a light-guiding and insulating material having a certain hardness, such as glass, quartz, or transparent resin.

At S720, forming a signal output part in the driving region.

At S730, forming a first electrode layer in the display region, where the first electrode layer is electrically coupled to the signal output part; the region where the first electrode layer is located includes a plurality of electrode regions each having a same area.

Specifically, the signal output part is formed in the driving region and the first electrode layer is formed in the display region by a film forming process (such as deposition, coating, sputtering or evaporation), and a region where the first electrode layer is located is divided into a plurality of electrode regions, each having a same area, along a direction gradually away from the signal output part, where the first electrode layer is made of a transparent conductive material, such as indium tin oxide or indium zinc oxide.

At S740, forming auxiliary electrodes in one-to-one correspondence with the electrode regions; the auxiliary electrodes are coupled in parallel with the first electrode layer, and the resistance of each auxiliary electrode is inversely correlated with the minimum distance from the electrode region corresponding to said each auxiliary electrode to the signal output part. That is, the resistance of the auxiliary electrode decreases as the minimum distance from the electrode region corresponding to the auxiliary electrode to the signal output part increases.

Illustratively, when the auxiliary electrode includes a plurality of conductive parts in a fixed form, the auxiliary electrode may be formed by a film forming process (e.g., deposition, coating, sputtering, or evaporation); certainly, other processes may be used.

As the distance from the electrode region to the driving region increases, the voltage attenuation also increases gradually, which seriously affects the uniformity of the display brightness of the screen. When the first electrode layer is made of the transparent conductive material, the problem of non-uniformity of display brightness is more serious. By adopting the display substrate provided by the embodiment of the present disclosure, the auxiliary electrodes are coupled in parallel to the first electrode layer, the farther the auxiliary electrode is away from the driving region, the smaller the resistance of the auxiliary electrode is, and the larger the correction degree of the auxiliary electrode on the voltage attenuation is, so that voltages at positions of the cathode layer are kept consistent, and the uniformity of the display brightness of the display region is improved.

As described above, in an implementation, the manufacturing method includes: before manufacturing the first electrode layer, forming a pixel defining layer in the display region, the pixel defining layer being between the base substrate and the cathode layer; and forming a first groove on a side of the pixel defining layer away from the base substrate.

Specifically, a pixel defining material layer is formed on the base substrate, and a thickness of the pixel defining material layer may be determined according to practical conditions, and is preferably between 1.5 μm and 2 μm. Then, the pixel defining material layer is patterned to obtain the pixel defining layer with a plurality of first grooves.

It should be noted that the manufacturing method provided in the embodiment of the present disclosure further includes: forming other layer structures, such as a TFT layer and a light emitting functional layer, on the base substrate, and aligning and assembling the base substrate formed with various functional structures thereon and an opposite substrate.

Figure 8:
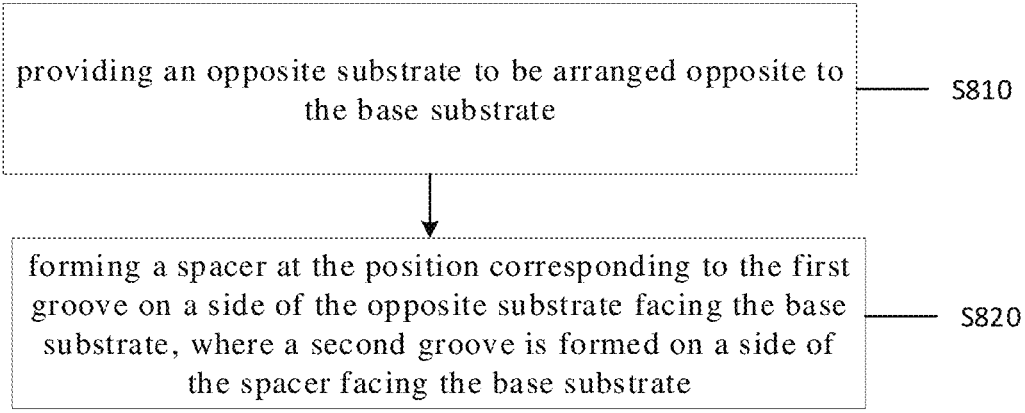
FIG. 8 is a flowchart of manufacturing an opposite substrate according to an embodiment of the present disclosure.
Figure 9:
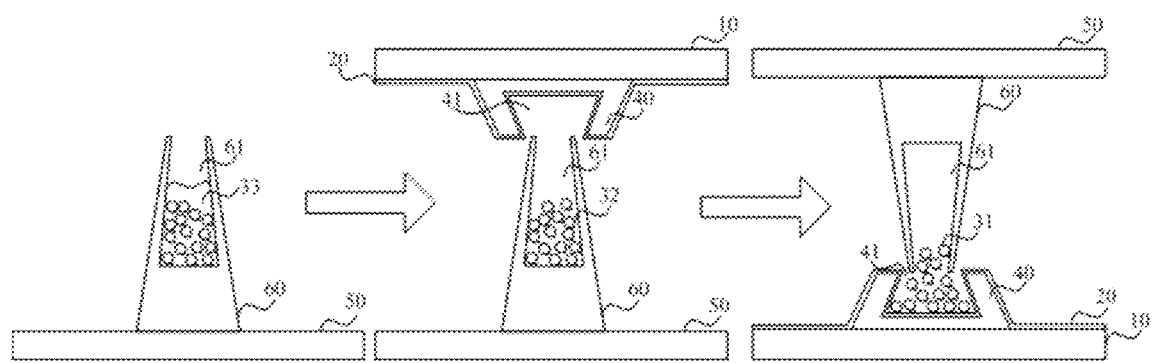
FIG. 9 is a schematic diagram of a process for manufacturing a conductive part according to an embodiment of the present disclosure.

In addition, the auxiliary electrode in the present embodiment may also be formed in the following manner as shown in FIGS. 8 and 9.

FIG. 8 is a flowchart of a manufacturing method of an opposite substrate according to an embodiment of the present disclosure, and as shown in FIG. 8, the manufacturing method of the display panel further includes the following steps S810 and S820.

At step S810, providing an opposite substrate to be arranged opposite to the base substrate.

Specifically, a black matrix is manufactured on the opposite substrate, a color filter material is coated on the opposite substrate in a slit coating method, and a color filter layer with a thickness of 2.0 microns is formed through pre-baking, exposure, development and post-baking and patterning; and then, a planarization layer material is coated on the color filter layer and the black matrix by using a spin coating method, and a planarization layer with a thickness of 2.0 microns is formed through pre-baking, exposing, developing, post-baking and patterning.

At step S820, forming a spacer at a position corresponding to the first groove on a side of the opposite substrate facing the base substrate, where a second groove is formed on a side of the spacer facing the base substrate.

Specifically, a spacer material layer is formed on a side, proximal to the base substrate, of the planarization layer, and the spacer material layer is patterned to obtain the spacer with a plurality of second grooves. A volume of the second groove is increased with the increase of the minimum distance from the electrode region corresponding to the second groove to the signal output part, and the position of the second groove on the planarization layer corresponds to the position of the first groove on the base substrate, so that a space for accommodating the conductive part is formed when the base substrate and the opposite substrate are aligned and assembled. The spacer material layer may be a photosensitive material layer, when the spacer material layer is patterned, a halftone mask plate is used for exposure, and then development is performed, so that the spacer with the plurality of second grooves is obtained.

In an implementation, FIG. 9 is a schematic diagram of a process for manufacturing the conductive part according to an embodiment of the present disclosure, and as shown in FIG. 9, the step of forming the auxiliary electrodes in one-to-one correspondence with the electrode regions, respectively, includes:

forming an intermediate conductive part 32 in each second groove 61.

The opposite substrate 50 and the base substrate 10 are aligned and assembled, so that the intermediate conductive part 32 in the second groove 61 falls into the first groove 41 to form the conductive part 31, where the auxiliary electrode includes a plurality of conductive parts 31 in the first groove 41.

As described above, in an implementation, the volume of the second groove 61 is positively correlated to the volume of the conductive part 31 corresponding to the second groove 61, and conductive parts 31 coupled in parallel with the first electrode layer 20 are uniformly distributed.

The step of forming the intermediate conductive part 32 in each second groove 61 includes:

injecting ink 33 in the second groove 61, where the ink 33 includes nano metal particles.

The ink is dried to form the intermediate conductive part 32 in each second groove 61.

When the ink is injected into each second groove 61, the ink fills up each second groove 61, since the larger the minimum distance from the second groove 61 to the signal output part is, the larger the volume of the second groove 61 is, after each second groove 61 is filled up with ink and dried, the farther the intermediate conductive part 32 from the signal output part is, the smaller the resistance of the intermediate conductive part 32 is, and the resistance of the conductive part 31 can be inversely correlated with the minimum distance from the conductive part 31 to the signal output part after the intermediate conductive part 32 falls into the first groove to form the conductive part.

In summary, when the conductive part 31 is made of the nano metal particles, the first groove 41 and the second groove 61 form a space for accommodating the conductive part, so that the nano metal particles can be prevented from leaking out and forming a defect of dark spot.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

The invention claimed is:

1. A display substrate, comprising:
    a base substrate, which comprises a display region and a driving region arranged on at least one side of the display region;
    a first electrode layer disposed in the display region;
    a signal output part disposed in the driving region, the first electrode layer is electrically coupled to the signal output part, and the first electrode layer comprises a plurality of electrode regions each having a same area; and
    a plurality of auxiliary electrodes, which are in one-to-one correspondence with the plurality of electrode regions and configured to be coupled in parallel with the first electrode layer, wherein a resistance of each auxiliary electrode is inversely correlated with a minimum distance from the electrode region corresponding to said each auxiliary electrode to the signal output part, wherein
    each auxiliary electrode comprises at least one conductive part having a resistance inversely correlated with a minimum distance from the electrode region corresponding to the conductive part to the signal output part, and conductive parts coupled in parallel to the first electrode layer are uniformly distributed,
    a pixel defining layer is further disposed in the display region, the pixel defining layer is located between the base substrate and the first electrode layer;
    a first groove is provided on a side of the pixel defining layer away from the base substrate, the first electrode layer covering outer sidewalls, inner sidewalls and a bottom surface of the first groove; and the conductive part is located in the first groove and on a side of the first electrode layer away from the base substrate, and is in contact with portions of the first electrode layer on the inner sidewalls and the bottom surface of the first groove.

2. The display substrate of claim 1, wherein the conductive part comprises a plurality of nano metal particles disposed in the first groove.

3. The display substrate of claim 2, wherein the number of the nano metal particles of the conductive part is positively correlated with a minimum distance from the conductive part to the signal output part.

4. A display panel, comprising the display substrate of claim 3.

5. A display panel, comprising the display substrate of claim 2.

6. A display panel, comprising the display substrate of claim 1.

7. The display panel of claim 6, wherein each auxiliary electrode comprises at least one conductive part having a resistance inversely correlated with a minimum distance from the electrode region corresponding to the conductive part to the signal output part, and conductive parts coupled in parallel to the first electrode layer are uniformly distributed; a pixel defining layer is further disposed in the display region, the pixel defining layer is located between the base substrate and the first electrode layer; a first groove is provided on a side of the pixel defining layer away from the base substrate; the conductive part is located in the first groove and on a side of the first electrode layer away from the base substrate, and wherein the display panel further comprises a opposite substrate which is arranged opposite to the display substrate; wherein a spacer is provided at a position corresponding to the first groove on a side of the opposite substrate facing the base substrate;

a second groove is provided on a side of the spacer facing the base substrate.

8. The display panel of claim 7, wherein an orthographic projection of the second groove on the base substrate is within an orthographic projection of the first groove corresponding thereto on the base substrate.

9. A display device, comprising the display panel of claim 8.

10. The display panel of claim 7, wherein the conductive part comprises a plurality of nano metal particles disposed in the first groove, the number of the nano metal particles of the conductive part is positively correlated with a minimum distance from the conductive part to the signal output part, and a volume of the second groove is positively correlated with the number of the nano metal particles of the conductive part corresponding thereto.

11. A display device, comprising the display panel of claim 10.

12. A display device, comprising the display panel of claim 7.

13. A display device, comprising the display panel of claim 6.

14. A manufacturing method of a display panel, comprising:

providing a base substrate, wherein the base substrate comprises a display region and a driving region arranged on at least one side of the display region;

forming a signal output part in the driving region;

forming a first electrode layer in the display region, the first electrode layer being electrically coupled to the signal output part; a region where the first electrode layer is located is divided into a plurality of electrode regions each having a same area;

forming a plurality of auxiliary electrodes in one-to-one correspondence with the electrode regions; the auxiliary electrodes are coupled in parallel with the first electrode layer, and a resistance of each auxiliary electrode is inversely correlated with a minimum distance from the electrode region corresponding to said each auxiliary electrode to the signal output part, wherein before forming the first electrode layer in the display region, forming a pixel defining layer in the display region, the pixel defining layer being located between the base substrate and the first electrode layer; and a first groove is formed on a side of the pixel defining layer away from the base substrate, wherein, the first electrode layer covering outer sidewalls, inner sidewalls and a bottom surface of the first groove the manufacturing method further comprises:

providing an opposite substrate to be arranged opposite to the base substrate;

forming a spacer at a position corresponding to the first groove, on a side of the opposite substrate facing the base substrate, wherein a second groove is formed on a side of the spacer facing the base substrate;

the forming the plurality of auxiliary electrodes in one-to-one correspondence with the electrode regions further comprises:

forming an intermediate conductive part in the second groove;

aligning and assembling the base substrate and the opposite substrate to enable the middle conductive part in the second groove to fall into the first groove to form a conductive part;

wherein the auxiliary electrode comprises at least one conductive part in the first groove.

15. The manufacturing method of claim 14, wherein a volume of the second groove is inversely correlated with a resistance of the conductive part corresponding thereto, and conductive parts coupled in parallel to the first electrode layer are uniformly distributed;

the forming the intermediate conductive part in the second groove comprises:

injecting ink into the second groove, wherein the ink comprises nano metal particles, and the number of the nano metal particles in the second groove is positively correlated with the volume of the second groove;

drying the ink to form the intermediate conductive part in the second groove.

* * * * *